United States Patent
Gopalakrishnan et al.

(10) Patent No.: US 6,523,161 B1
(45) Date of Patent: Feb. 18, 2003

(54) METHOD TO OPTIMIZE NET LISTS USING SIMULTANEOUS PLACEMENT AND LOGIC OPTIMIZATION

(75) Inventors: Padmini Gopalakrishnan, Sunnyvale, CA (US); Salil Raje, San Jose, CA (US)

(73) Assignee: Monterey Design Systems, Inc., Sunnyvale, CA (US)

( * ) Notice: Subject to any disclaimer, the term of this patent is extended or adjusted under 35 U.S.C. 154(b) by 170 days.

(21) Appl. No.: 09/679,144

(22) Filed: Oct. 3, 2000

(51) Int. Cl.[7] .......................... G06F 17/50; H01L 21/82
(52) U.S. Cl. ........................ 716/18; 716/1; 716/7; 716/8; 716/10; 716/17; 716/18; 703/14; 438/129
(58) Field of Search ............................................ 716/18

(56) References Cited

U.S. PATENT DOCUMENTS

| | | | | |
|---|---|---|---|---|
| 4,745,084 A | * | 5/1988 | Rowson et al. ............. 438/129 |
| 5,638,291 A | * | 6/1997 | Li et al. ........................ 716/18 |
| 5,666,288 A | * | 9/1997 | Jones et al. .................... 716/17 |
| 5,787,010 A | * | 7/1998 | Schaefer et al. ............... 716/7 |
| 5,953,518 A | * | 9/1999 | Sugasawara et al. .......... 716/10 |
| 6,080,201 A | * | 6/2000 | Hojat et al. ................... 703/14 |
| 6,192,504 B1 | * | 2/2001 | Pfluger et al. ................. 716/1 |
| 6,286,128 B1 | * | 9/2001 | Pileggi et al. ................ 716/10 |
| 6,314,547 B1 | * | 11/2001 | Donath et al. ................. 716/8 |
| 6,334,205 B1 | * | 12/2001 | Iyer et al. ...................... 716/7 |

* cited by examiner

Primary Examiner—Matthew Smith
Assistant Examiner—Andrea Liu
(74) Attorney, Agent, or Firm—Vierra Magen Marcus Harmon & DeNiro LLP

(57) ABSTRACT

Method to optimize net lists used in the design and fabrication of integrated circuits by using simultaneous placement optimization, logic function optimization and net buffering algorithms. Method simultaneously obtains a placement of logic functions, mapping of logic functions on to library elements and buffering of nets connecting the logic functions.

42 Claims, 4 Drawing Sheets

Placement in bins

Critical section in the design

Best Moves For Each Gate

Cell 1: {Bin 2, Size 4}
Cell 2: {Bin 3, Size 1}
Cell 3: {Bin 1, Size A}
Cell 4: {Bin 2, Size B}
Cell 5: {Bin 5, Size P}
Cell 6: {Bin 3, Size P}

METHOD TO OPTIMIZE NET LISTS USING SIMULTANEOUS PLACEMENT AND LOGIC OPTIMIZATION

FIELD OF INVENTION

Invention relates to design of integrated circuits and more particularly to a method for optimizing net lists using simultaneous placement optimization, logic function optimization and net buffering.

BACKGROUND OF INVENTION

Prior art methods use a mathematical expression to provide an analytical solution for simultaneous placement of logic functions and logic optimization. The solution of such a mathematical expression would lie in the continuous domain. Furthermore, mapping this solution into a valid placement and a valid implementation of each logic function can lead to loss of optimality.

Therefore, there is a need for a method that will overcome the deficiencies found in the prior art.

SUMMARY OF INVENTION

Invention discloses a method for the design and fabrication of integrated circuits to optimize signal timing and circuit performance.

The method simultaneously obtains a placement of logic functions, mapping of logic functions onto library elements and buffering of nets connecting the logic functions to optimize signal timing. Logic functions may be moved between bins and or may be optimized to obtain the best cost. A best buffering solution is also computed for each logic function's location and size.

DETAILED DESCRIPTION OF PREFERRED EMBODIMENT(s)

Preferred embodiment is a method to simultaneously obtain a placement of logic functions wherein a logic function is an electrical circuit including logic gates and memory devices, mapping of logic functions onto library elements and buffering of nets to optimize timing in integrated circuits. Preferred embodiment is based on the Fidducia-Mattheyses optimization algorithm. Other optimization algorithms that are known in the art, such as simulated annealing and genetic algorithms, for example, could be used without deviating from the invention.

Figure 1:
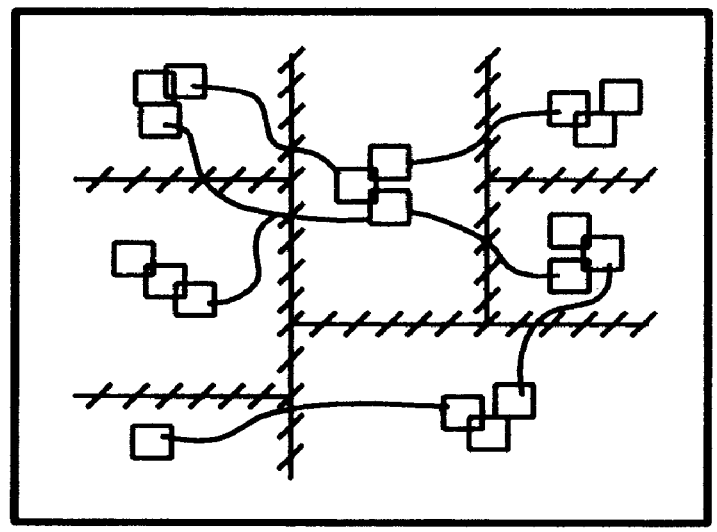
FIG. 1 shows logic functions placed in bins.
Figure 7:
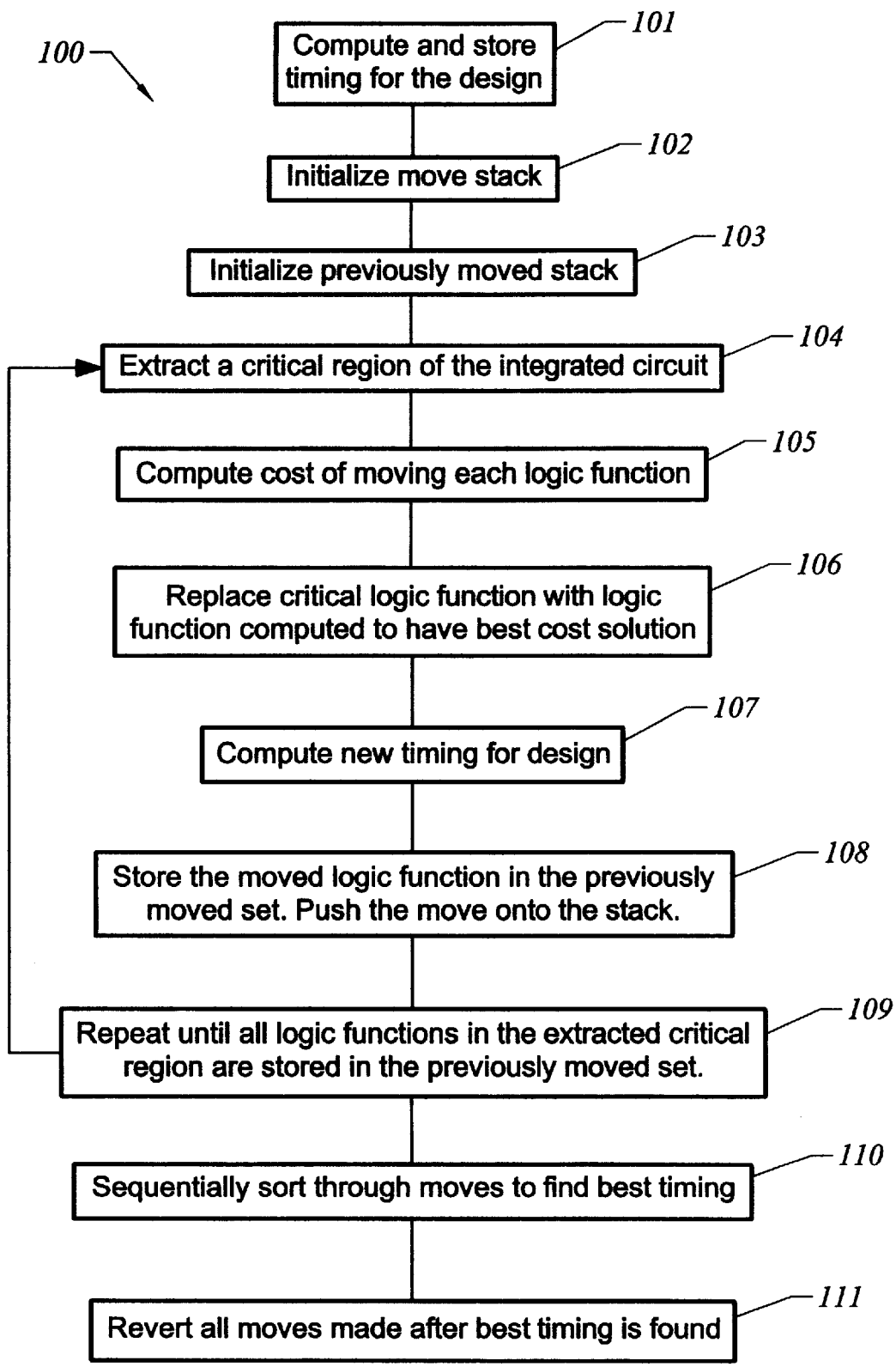
FIG. 7 shows a flow diagram of the method.

Method 100 consists of the following steps as shown in FIG. 7:

1. Compute and store timing for the design 101. A preliminary circuit is created to accomplish desired function of an integrated circuit. Timing information for each of the logic functions in the circuit is computed and stored to provide a base-line for subsequent attempts to reduce signal timing. FIG. 1 shows a possible initial configuration for the design. Possible locations are given by the center of the bins where each bin contains logic functions.

2. Initialize move stack with current timing information for the design 102.

3. Initialize previously moved set 103. Set contains a historical list of previously moved logic functions.

Figure 2:
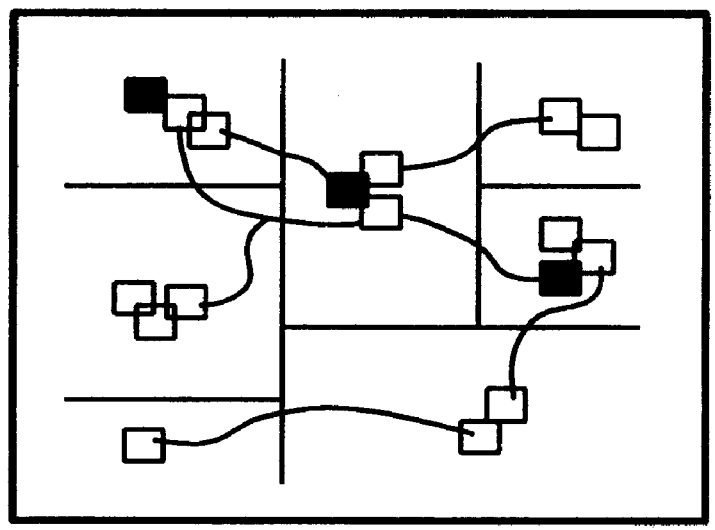
FIG. 2 shows a critical region of an integrated circuit.

4. Extract a critical region of the integrated circuit 104. Critical region contains a subset of logic functions that do not satisfy a desired timing specification for an integrated circuit. Timing specification of an integrated circuit states when to expect signals at the output of a logic function and when signals arrive at its input. Slack is the difference in time between when a signal is required at the output of a logic function and the time when it actually arrives at the output. Negative slack signifies an undesirable delay in signal propagation through a logic function. Each logic function that has a negative slack is classified as critical. FIG. 2 shows a critical region of an integrated circuit with logic functions and connecting nets.

Figures 3, 4:
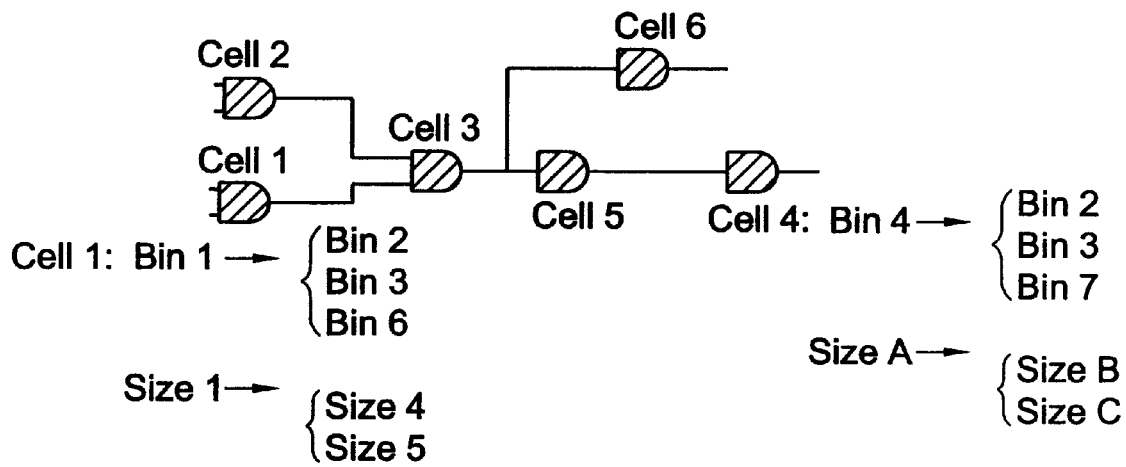
FIG. 3 shows a list of possible moves for a logic function.
FIG. 4 shows a list of best moves for each logic function.

5. Compute cost of moving each logic function 105. By excluding logic functions listed in the previously moved set, a simultaneous operation is performed on each logic function to bring it within the required timing specification. The following simultaneous operation is performed on each critical logic function:

a) Physically relocate each logic function to improve slack by making moves that optimize the distribution of electrical load along the signal path. The locations of the logic functions are chosen from a set of valid locations such as within a bin, for example. Bins are obtained by dividing the area of the integrated circuit into equal sized regions.

b) Perform a logic optimization move by changing the mapping of a logic function from one library element to another. A logic optimization move will pick a sized function from the library to achieve optimum timing. A logic function can be implemented by an equivalent plurality of circuit configurations having a plurality of physical sizes. A circuit is implemented by a plurality of semiconductor gates. The library contains elements of equivalent circuit configurations for each logical function.

c) Determine best buffering solution on nets connected to each logic function. Repeaters are inserted at points along a net where needed to achieve best cost solution. FIG. 3 and FIG. 4 show a set of possible moves in an implementation of the method. The example shows logic functions consisting of individual cells and contemplated moves of the cells to another bin location, changing its function size or both sizing and moving the cells simultaneously.

Figure 5:
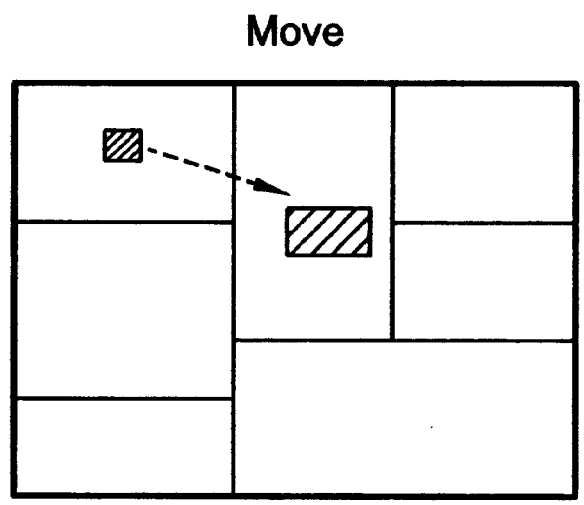
FIG. 5 shows a physical move of a logic function.

6. Replace critical logic function with logic function computed and relocate it to have the best cost solution 106. FIG. 5 shows an example of a possible replacement. The cell is relocated to a different section of the chip. A larger sized implementation of its logic function has been selected from the library.

7. Update the timing information for design 107. The original location and original physical implementation of each moved logic function along with the new timing is pushed onto the move stack.

8. Store the moved logic function in the previously moved set 108.

9. Repeat steps 4 through 7 until all logic functions in the extracted critical region are stored in the previously moved set 109.

Figure 6:
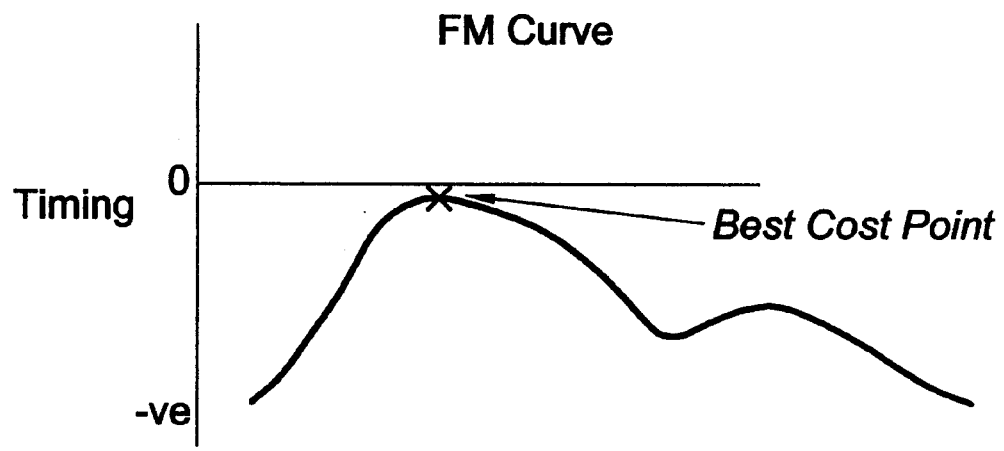
FIG. 6 shows a graph plotting the best cost point for a logic function.

10. Sequentially sort through the moves in the move stack to find the best timing during the sequence of moves and note its location in the move stack 110. FIG. 6 shows a graph of the cost of each move in a sequence where the best cost point is shown.

11. Revert all moves made after best timing is found using the move stack and the location of the best timing found in step 10 110.

Foregoing described embodiments of the invention are provided as illustrations and descriptions. They are not intended to limit the invention to precise form described.

In particular, Applicants contemplate that functional implementation of invention described herein may be implemented equivalently in hardware, software, firmware, and/or other available functional components or building blocks.

Other variations and embodiments are possible in light of above teachings, and it is thus intended that the scope of invention not be limited by this Detailed Description, but rather by Claims following.

What is claimed is:

1. A method of altering a net list, said method comprising the steps of:

(a) selecting a set of logic functions identified in said net list;

(b) for each logic function in said set of logic functions, determining a cost associated with a relocation and a logic optimization; and (c) implementing a selected relocation and a selected logic optimization for a logic function in said set of logic functions in response, at least in part, to said costs determined in said step (b).

2. A method according to claim 1, wherein said step (c) includes the steps of:

(1) removing said logic function from said set of logic functions; and (2) adding a new logic function to said set of logic functions, wherein said new logic function has a location corresponding to said selected relocation for said logic function and a logic function mapping corresponding to said selected logic optimization for said logic function.

3. A method according to claim 2, wherein said method further includes the step of:

(d) repeating said steps (b) and (c) for logic functions selected in said step (a) and remaining in said set of logic functions, until a threshold amount of logic functions in said set of logic functions selected in said step (a) are removed from said set of logic functions.

4. A method according to claim 3, wherein said threshold amount of logic functions is all logic functions in said set of logic functions selected in said step (a).

5. A method according to claim 3, wherein said set of logic functions is adapted to perform an operation and wherein said method includes the steps of:

(e) identifying a state of said set of logic functions wherein said operation is performed in a best time; and (f) replacing at least one logic function in said set of logic functions with at least one logic function removed in said step (c)(1) to put said set of logic functions in said state.

6. A method according to claim 5, wherein said step (c) includes the steps of:

(3) maintaining at least one record of said logic function removed in said step (c)(1); and (4) maintaining a record associated with a time for a state of said set of logic functions to perform said operation after said steps (c)(1) and (c)(2) have been completed.

7. A method according to claim 6, wherein said step (e) is employed using at least one record maintained in said step (c)(4).

8. A method according to claim 7, wherein said step (f) is performed using said at least one record maintained in said step (c)(3).

9. A method according to claim 1, wherein said step (c) is performed in response, at least in part, to a comparison of said cost determined in said step (b) for said logic function and said costs determined in said step (b) for other logic functions in said set of logic functions.

10. A method according to claim 9, wherein said comparison identifies a best cost.

11. A method according to claim 1, wherein said step (b) includes the steps of:

(1) for each logic function in said set of logic functions, determining a component of said cost corresponding to said relocation;

(2) for each logic function in said set of logic functions, determining a component of said cost corresponding to said logic optimization; and (3) for each logic function in said set of logic functions, determining a best buffering solution corresponding to said relocation and said logic optimization.

12. A method according to claim 11, wherein said cost is based at least in part on said best buffering solution.

13. A method according to claim 11, wherein said logic optimization corresponds to a mapping of a logic function from one element in a library to another element in said library.

14. A method according to claim 11, wherein said logic optimization corresponds to a size change for a logic function.

15. A method according to claim 11, wherein said relocation corresponds to a placement change.

16. A method according to claim 11, wherein each logic function in said set of logic functions includes at least one gate.

17. A method according to claim 11, wherein said step (c) improves slack for said logic function.

18. A method of altering a net list, said method comprising the steps of:

(a) selecting a set of logic functions identified in said net list;

(b) for each logic function in said set of logic functions, determining a cost associated with a relocation and a logic optimization;

(c) removing a logic function from said set of logic functions, wherein said logic function is removed in response, at least in part, to said costs determined in said step (b); and (d) adding a new logic function to said set of logic functions, wherein said new logic function has a location corresponding to a selected relocation for said logic function and a logic function mapping corresponding to a selected logic optimization for said logic function.

19. A method according to claim 18, wherein said set of logic functions is adapted to perform an operation and said method further includes the steps of:

(e) repeating said steps (b), (c), and (d) for logic functions selected in said step (a) and remaining in said set of logic functions, until a threshold amount of logic functions in said set of logic functions selected in said step (a) are removed from said set of logic functions;

(f) identifying a state of said set of logic functions wherein said operation is performed in a best time; and (g) replacing at least one logic function in said set of logic functions with at least one logic function removed in said step (c) to put said set of logic functions in said state.

20. A method according to claim 19, wherein said threshold amount of logic functions is all logic functions in said set of logic functions selected in said step (a).

21. A method according to claim 19, wherein said method further includes the steps of:

(h) maintaining at least one record of said logic function removed in said step (c), wherein said step (g) is performed using said at least one record maintained in said step (h); and (i) maintaining a record associated with a time for a state of said set of logic functions to perform said operation after said steps (c) and (d) have been completed, wherein said step (f) is employed using at least one record maintained in said step (i).

22. A method according to claim 18, wherein said step (c) is performed in response, at least in part, to a comparison of said costs determined in said step (b) and said comparison identifies a best cost.

23. A method according to claim 18, wherein said step (b) includes the steps of:

(1) for each logic function in said set of logic functions, determining a component of said cost corresponding to said relocation;

(2) for each logic function in said set of logic functions, determining a component of said cost corresponding to said logic optimization; and (3) for each logic function in said set of logic functions, determining a best buffering solution corresponding to said relocation and said logic optimization, wherein said cost is based at least in part on said best buffering solution.

24. A method of altering a net list, said method comprising the steps of:

(a) selecting a set of logic functions identified in said net list;

(b) for each logic function in said set of logic functions, determining a cost associated with a relocation and a logic optimization, wherein said step (b) includes the steps of:

(1) for each logic function in said set of logic functions, determining a component of said cost corresponding to said relocation, (2) for each logic function in said set of logic functions, determining a component of said cost corresponding to said logic optimization, and (3) for each logic function in said set of logic functions, determining a best buffering solution corresponding to said relocation and said logic optimization; and (c) implementing a selected relocation and a selected logic optimization for a logic function in said set of logic functions in response, at least in part, to said costs determined in said step (b).

25. A method according to claim 24, wherein said step (c) includes the steps of:

(1) removing said logic function from said set of logic functions; aid (2) adding a new logic function to said set of logic functions, wherein said new logic function has a location corresponding to said selected relocation for said logic function and a logic function mapping corresponding to said selected logic optimization for said logic function.

26. A method according to claim 25, wherein said set of logic functions is adapted to perform an operation and said method further includes the steps of:

(d) repeating said steps (b) and (c) for logic functions selected in said step (a) and remaining in said set of logic functions, until all logic functions in said set of logic functions selected in said step (a) are removed from said set of logic functions;

(e) identifying a state of said set of logic functions wherein said operation is performed in a best time; and (f) replacing at least one logic function in said set of logic functions with at least one logic function removed in said step (c)(1) to put said set of logic functions in said state.

27. A method according to claim 25, wherein said cost is based at least in part on said best buffering solution.

28. A computer readable medium having computer readable code embodied on said computer readable medium, said computer readable code for programming said computer to perform a method of altering a net list, said method comprising the steps of:

(a) selecting a set of logic functions identified in said net list;

(b) for each logic function in said set of logic functions, determining a cost associated with a relocation and a logic optimization; and (c) implementing a selected relocation and a selected logic optimization for a logic function in said set of logic functions in response, at least in part, to said costs determined in said step (b).

29. A computer readable medium according to claim 28, wherein said step (c) includes the steps of:

(1) removing said logic function from said set of logic functions; and (2) adding a new logic function to said set of logic functions, wherein said new logic function has a location corresponding to said selected relocation for said logic function and a logic function mapping corresponding to said selected logic optimization for said logic function.

30. A computer readable medium according to claim 29, wherein said method further includes the steps of:

(d) repeating said steps (b) and (c) for logic functions selected in said step (a) and remaining in said set of logic functions, until a threshold amount of logic functions in said set of logic functions selected in said step (a) are removed from said set of logic functions;

(e) identifying a state of said set of logic functions wherein said operation is performed in a best time; and (f) replacing at least one logic function in said set of logic functions with at least one logic function removed in said step (c)(1) to put said set of logic functions in said state.

31. A computer readable medium according to claim 30, wherein said threshold amount of logic functions is all logic functions in said set of logic functions selected in said step (a).

32. A computer readable medium according to claim 30, wherein said step (c) includes the steps of:

(3) maintaining at least one record of said logic function removed in said step (c)(1); and (4) maintaining a record associated with a time for a state of said set of logic functions to perform said operation after said steps (c)(1) and (c)(2) have been completed.

33. A computer readable medium according to claim 32, wherein said step (e) is employed using at least one record maintained in said step (c)(4); and said step (f) is performed using said at least one record maintained in said step (c)(3).

34. A computer readable medium according to claim 28, wherein said step (b) includes the steps of:

(1) for each logic function in said set of logic functions, determining a component of said cost corresponding to said relocation;

(2) for each logic function in said set of logic functions, determining a component of said cost corresponding to said logic optimization; and (3) for each logic function in said set of logic functions, determining a best buffering solution corresponding to said relocation and said logic optimization, wherein said cost is based at least in part on said best buffering solution.

35. A computer readable medium having computer readable code embodied on said computer readable medium, said computer readable code for programming said computer to perform a method of altering a net list, said method comprising the steps of:

(a) selecting a set of logic functions identified in said net list;

(b) for each logic function in said set of logic functions, determining a cost associated with a relocation and a logic optimization;

(c) removing a logic function from said set of logic functions, wherein said logic function is removed in response, at least in part, to said costs determined in said step (b); and (d) adding a new logic function to said set of logic functions, wherein said new logic function has a location corresponding to a selected relocation for said logic function and a logic function mapping corresponding to a selected logic optimization for said logic function.

36. A computer readable medium according to claim 35, wherein said set of logic functions is adapted to perform an operation and said method further includes the steps of:

(e) repeating said steps (b), (c), and (d) for logic functions selected in said step (a) and remaining in said set of logic functions, until all logic functions in said set of logic functions selected in said step (a) are removed from said set of logic functions;

(f) identifying a state of said set of logic function s wherein said operation is performed in a best time; and (g) replacing at least one logic function in said set of logic functions with at least one logic function removed in said step (c) to put said set of logic functions in said state.

37. A computer readable medium according to claim 36, wherein said method further includes the steps of:

(h) maintaining at least one record of said logic function removed in said step (c), wherein said step (g) is performed using said at least one record maintained in said step (h); and (i) maintaining a record associated with a time for a state of said set of logic function s to perform said operation after said steps (c) and (d) have been completed, wherein said step (f) is employed using at least one record maintained in said step (i).

38. A computer readable medium according to claim 35, wherein said step (b) includes the steps of:

(1) for each logic function in said set of logic functions, determining a component of said cost corresponding to said relocation (2) for each logic function in said set of logic functions, determining a component of said cost corresponding to said logic optimization; and (3) for each logic function in said set of logic functions, determining a best buffering solution corresponding to said relocation and said logic optimization, wherein said cost is based at least in part on said best buffering solution.

39. A computer readable medium having computer readable code embodied on said computer readable medium, said computer readable code for programming said computer to perform a method of altering a net list, said method comprising the steps of:

(a) selecting a set of logic functions identified in said net list;

(b) for each logic function in said set of logic functions, determining a cost associated with a relocation and a logic optimization, wherein said step (b) includes the steps of:

(1) for each logic function in said set of logic functions, determining a component of said cost corresponding to said relocation, (2) for each logic function in said set of logic functions, determining a component of said cost corresponding to said logic optimization, and (3) for each logic function in said set of logic functions, determining a best buffering solution corresponding to said relocation and said logic optimization; and (c) implementing a selected relocation and a selected logic optimization for a logic function in said set of logic functions in response, at least in part, to said costs determined in said step (b).

40. A computer readable medium according to claim 39, wherein said step (c) includes the steps of:

(1) removing said logic function from said set of logic functions; and (2) adding a new logic function to said set of logic functions, wherein said new logic function has a location corresponding to said selected relocation for said logic function and a logic function mapping corresponding to said selected logic optimization for said logic function.

41. A computer readable medium according to claim 40, wherein said set of logic functions is adapted to perform an operation and said method further includes the step of:

(d) repeating said steps (b) and (c) for logic functions selected in said step (a) and remaining in said set of logic functions, until all logic functions in said set of logic functions selected in said step (a) are removed from said set of logic functions;

(e) identifying a state of said set of logic functions wherein said operation is performed in a best time; and (f) replacing at least one logic function in said set of logic functions with at least one logic function removed in said step (c)(1) to put said set of logic functions in said state.

42. A computer readable medium according to claim 39, wherein said cost is based at least in part on said best buffering solution.

* * * * *

UNITED STATES PATENT AND TRADEMARK OFFICE
CERTIFICATE OF CORRECTION

PATENT NO. : 6,523,161 B1 Page 1 of 1
DATED : February 18, 2003
INVENTOR(S) : Gopalakrishnan It is certified that error appears in the above-identified patent and that said Letters Patent is hereby corrected as shown below:

Column 4,
Lines 34, 41 and 46, after "claim" and before "wherein" insert -- 1, --
Lines 38 and 43, after "claim" and before "wherein" should be -- 1, --

Column 5,
Line 67, after "functions;" delete "aid" and input -- and --

Column 7,
Line 51, after "logic" and before "wherein" replace "function s" with -- functions --.

Signed and Sealed this

Thirtieth Day of November, 2004

JON W. DUDAS
*Director of the United States Patent and Trademark Office*